US010055896B1

(12) United States Patent
Leedom

(10) Patent No.: US 10,055,896 B1
(45) Date of Patent: Aug. 21, 2018

(54) INTERACTIVE VERTEX MANIPULATION SYSTEM AND METHODS FOR GEOMETRY REPAIR

(71) Applicant: MSC.Software Corporation, Newport Beach, CA (US)

(72) Inventor: James Harvey Leedom, Columbus, NJ (US)

(73) Assignee: MSC.Software Corporation, Newport Beach, CA (US)

(*) Notice: Subject to any disclaimer, the term of this patent is extended or adjusted under 35 U.S.C. 154(b) by 56 days.

(21) Appl. No.: 15/207,220

(22) Filed: Jul. 11, 2016

Related U.S. Application Data

(62) Division of application No. 13/335,849, filed on Dec. 22, 2011, now Pat. No. 9,607,422.

(51) Int. Cl.
G06T 15/00 (2011.01)
G06T 19/20 (2011.01)
G06F 17/50 (2006.01)

(52) U.S. Cl.
CPC .......... *G06T 19/20* (2013.01); *G06F 17/5009* (2013.01); *G06T 2219/012* (2013.01); *G06T 2219/2021* (2013.01)

(58) Field of Classification Search
CPC ..................................... G06T 19/20
USPC ......................................... 345/419
See application file for complete search history.

(56) References Cited

U.S. PATENT DOCUMENTS

| 6,608,631 | B1* | 8/2003 | Milliron | G06T 13/00 345/619 |
| 7,694,238 | B2* | 4/2010 | Gibson | G06F 17/50 715/848 |
| 7,847,799 | B2* | 12/2010 | Taubin | G06T 9/00 345/419 |
| 8,777,458 | B2* | 7/2014 | Seki | G02B 19/0061 362/311.07 |
| 9,026,407 | B1* | 5/2015 | Kennefick | G06T 19/20 703/1 |
| 9,747,716 | B1* | 8/2017 | Mallet | G06T 13/40 |
| 2004/0090437 | A1* | 5/2004 | Uesaki | G06T 17/30 345/420 |
| 2005/0032028 | A1* | 2/2005 | Chosack | G09B 23/32 434/262 |
| 2007/0085851 | A1* | 4/2007 | Muller | G06T 13/20 345/474 |
| 2007/0116335 | A1* | 5/2007 | Capolunghi | G06T 7/12 382/128 |
| 2009/0136103 | A1* | 5/2009 | Sonka | G06K 9/4638 382/128 |

(Continued)

OTHER PUBLICATIONS

U.S. Notice of Allowance dated Nov. 17, 2016, from related U.S. Appl. No. 13/335,849.

(Continued)

*Primary Examiner* — Javid A Amini
(74) *Attorney, Agent, or Firm* — Foley & Lardner LLP

(57) ABSTRACT

A method for simulating a physical object includes receiving user input to move a vertex of a simulated surface from a first location to a second location that is across an edge of the surface. The method also includes generating a visual display that is configured to inform the user that the movement of a vertex to the second location across an edge of the surface is unpermitted.

15 Claims, 16 Drawing Sheets

(56) References Cited

U.S. PATENT DOCUMENTS

| | | | |
|---|---|---|---|
| 2009/0231331 A1* | 9/2009 | Holland | H04N 13/0275 345/419 |
| 2010/0111370 A1* | 5/2010 | Black | G06K 9/00369 382/111 |
| 2010/0305928 A1* | 12/2010 | Cohen | G06F 19/321 703/11 |
| 2011/0050691 A1* | 3/2011 | Hamedi | G06T 17/205 345/420 |
| 2011/0074766 A1* | 3/2011 | Page | G06T 11/203 345/419 |
| 2011/0082667 A1* | 4/2011 | Ibarz | G06T 15/503 703/1 |
| 2011/0148867 A1* | 6/2011 | Yanami | G06T 17/30 345/419 |
| 2011/0161061 A1* | 6/2011 | Wu | G06T 17/20 703/2 |
| 2011/0181711 A1* | 7/2011 | Reid | G06T 19/003 348/121 |
| 2011/0285822 A1* | 11/2011 | Dai | G06T 7/0073 348/46 |
| 2012/0078590 A1* | 3/2012 | Hao | G06T 17/20 703/1 |
| 2012/0182403 A1* | 7/2012 | Lange | G02B 27/22 348/51 |

OTHER PUBLICATIONS

U.S. Office Action dated Dec. 16, 2015, from related U.S. Appl. No. 13/335,849.

U.S. Office Action dated Jun. 13, 2016, from related U.S. Appl. No. 13/335,849.

\* cited by examiner

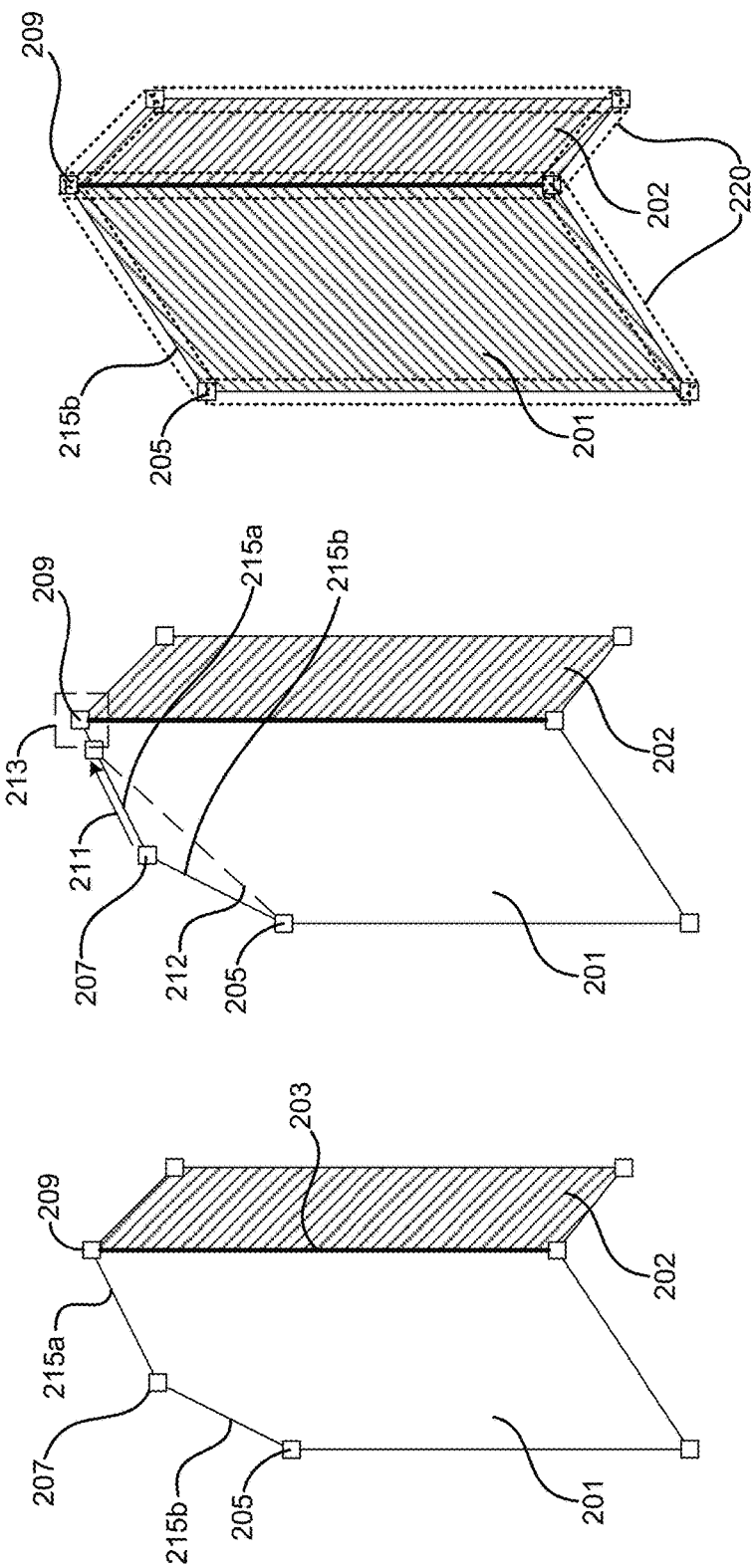

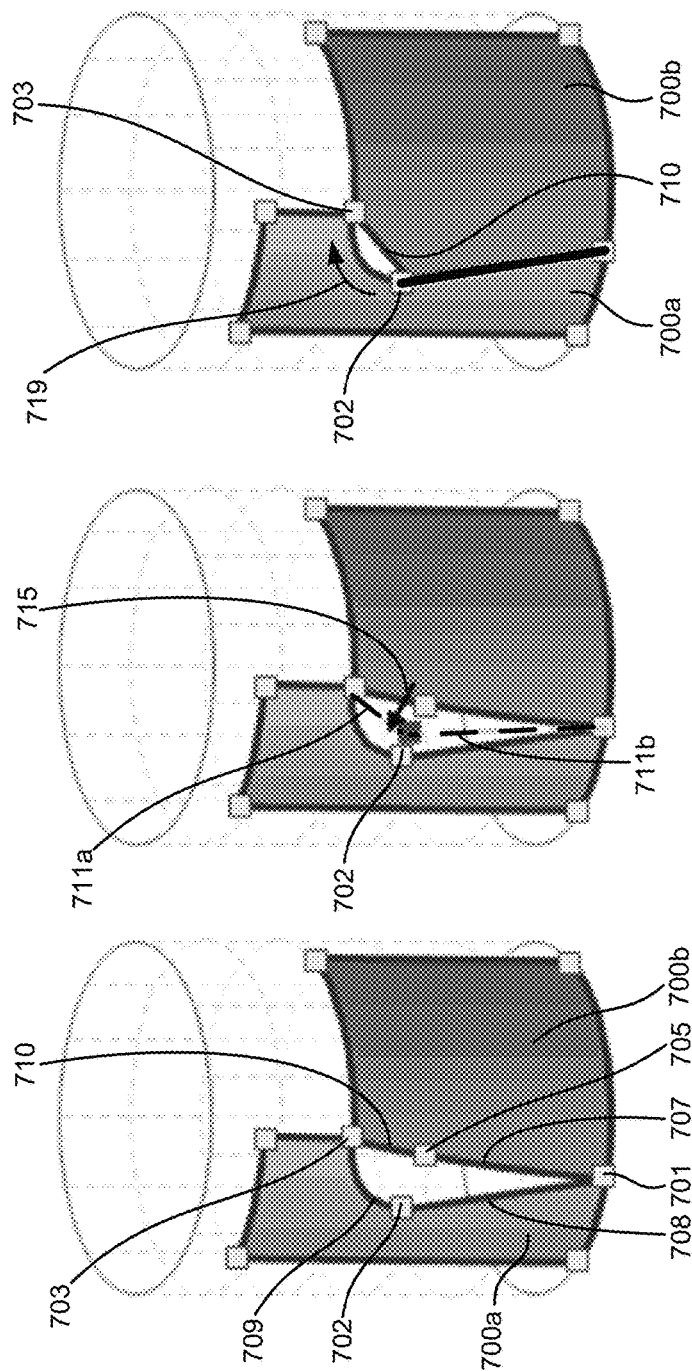

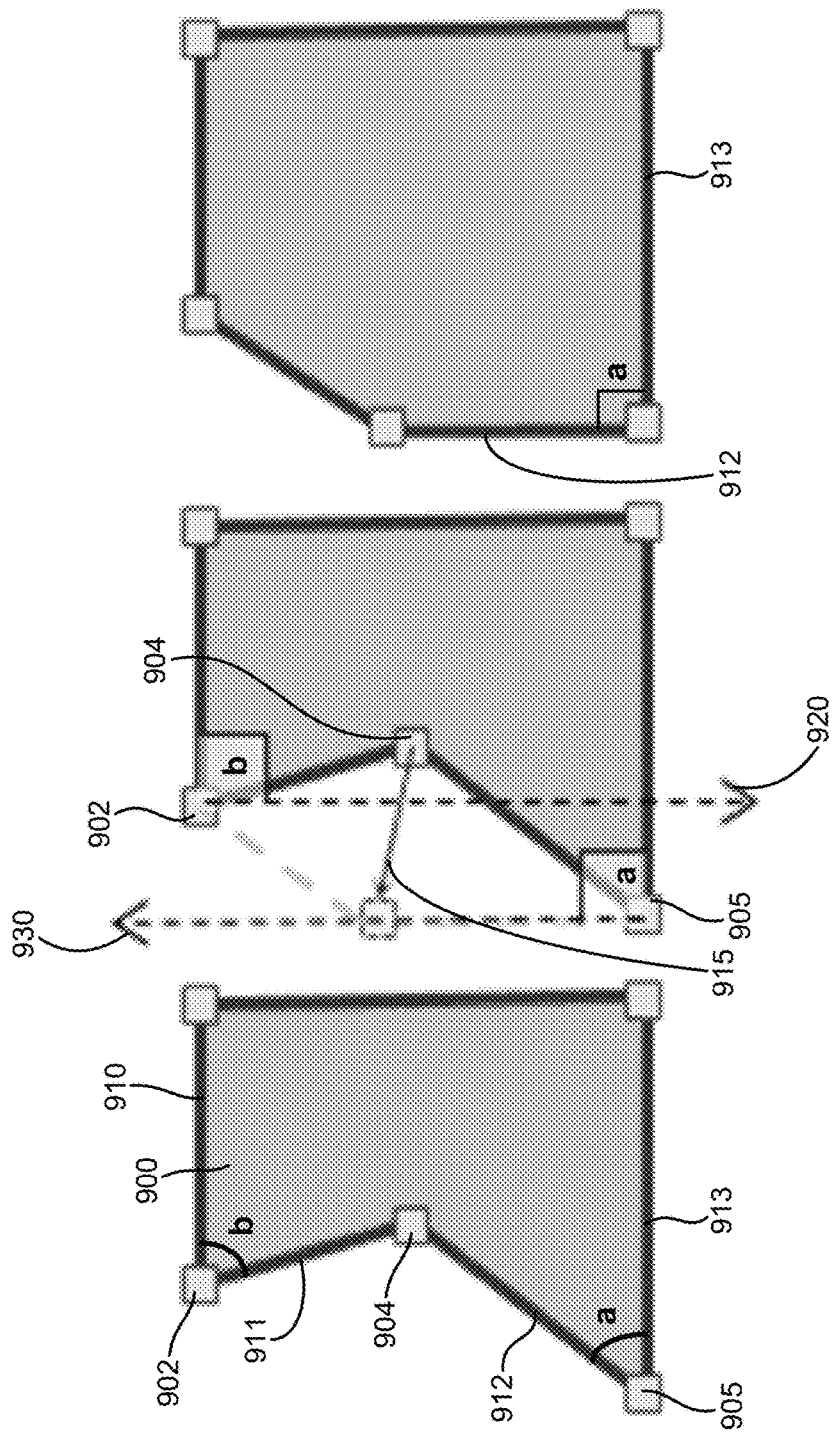

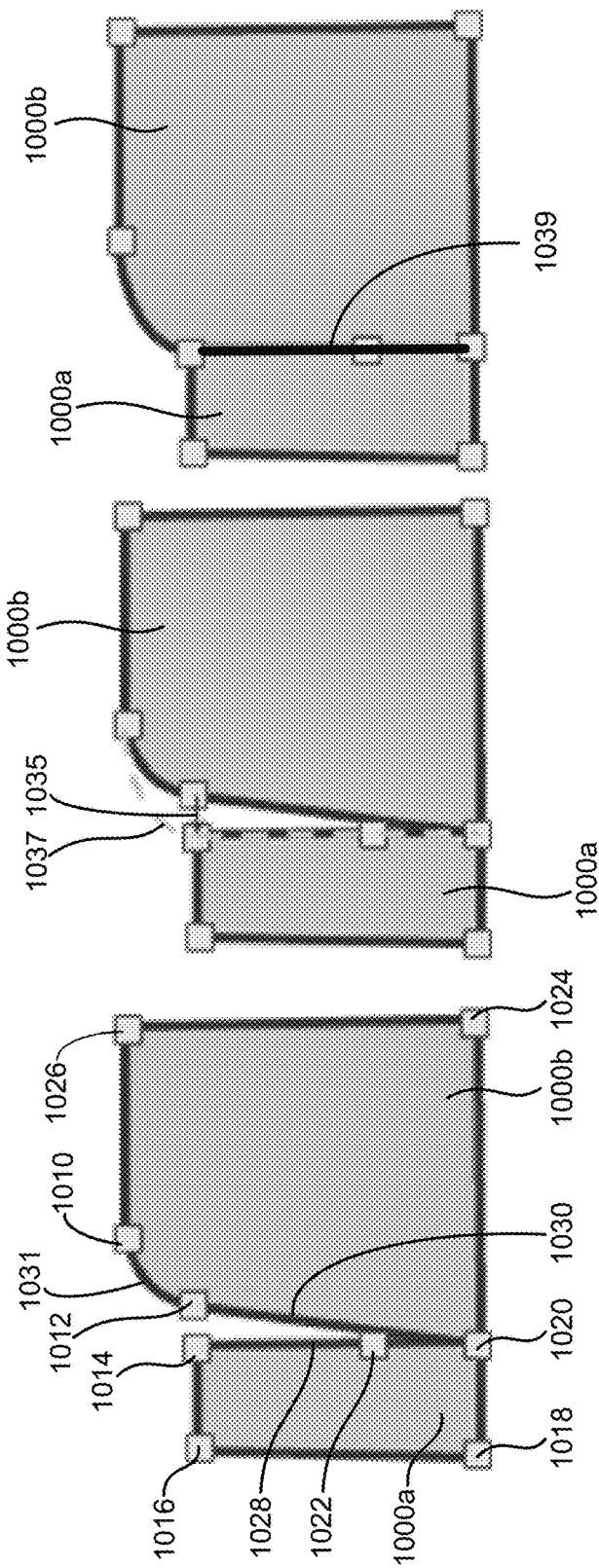

INTERACTIVE VERTEX MANIPULATION SYSTEM AND METHODS FOR GEOMETRY REPAIR

CROSS-REFERENCE TO RELATED PATENT APPLICATIONS

This application is a Divisional of U.S. application Ser. No. 13/335,849, filed Dec. 22, 2011, which is incorporated herein by reference in its entirety.

BACKGROUND

Manufacturing complex systems and products include creating computer-aided design models and conducting tests on the models to determine their performance. Generating a functional model is a time-consuming process and reducing the amount of time for creating a model is beneficial to any product manufacturer.

During the CAE geometry modeling process, a user may adjust surface boundaries using a plurality of tools. Users adjust the geometry, edit surfaces during idealization or mid-surfacing, or adjust the geometry topology for mesh control. Plurality of tools can correct the geometric errors and aberrations. Embodiments of the present invention are directed to expediting the creation of computer models for physical objects.

SUMMARY OF THE DISCLOSURE

Embodiments of interactive simulation and solver are directed to a system that includes a vertex logic that is configured to receive user input to move a selected attribute of a surface that is part of a simulated object and a collapse logic that is configured to determine an area of the surface and remove all attributes of the surface of the simulated object as the area of the surface approaches zero.

Embodiments of the interactive simulation environment includes a method for simulating a physical object by receiving user input to move a vertex of a simulated surface from a first location to a second location that is across an edge of the surface. The method also includes generating a visual display that is configured to inform the user that the movement of a vertex to the second location across an edge of the surface is unpermitted.

Embodiments of the interactive simulation environment include a system having a processor configured to generate a visual simulation of an object with one or more surfaces. The system displays each surface having a vertex, the vertex being connected to a first edge and a second edge. The object includes the second edge being connected to a third edge at an angle. The processor is configured to receive input from a user input device to move a vertex from a first location to a second location. The processor is configured to generate a curve in the second edge such that the angle at one end of the second edge and the third edge remains unchanged.

Embodiments of the interactive simulation environment may include a device that includes a means for receiving user input to move a selected attribute of a surface that is part of a simulated object. The device also includes a means for determining an area of the surface after moving the selected attribute and a means for removing all attributes of the surface of the simulated object as the area of the surface approaches zero.

Embodiments of interactive simulation and solver have various advantages, such as reduced software training for the user, and intuitive interaction with the geometry, requiring less skill of the user and faster geometry repair and edits. The implementation of vertex manipulation along with its rules allows many traditional discrete geometry editing tools to be eliminated. The users are not required to learn where to find and how to use these numerous traditional tools. Dragging vertices of a surface may be considered an optimal way of interacting with surfaces and curves, resulting in less industry specific knowledge being required in order to modify the geometry. The geometry of an object can be manipulated in ways similar to physical materials, and therefore a lower threshold of accumulated skill is required for users to be efficient. Fewer steps are required when the user manipulates the vertex. The user is required to use little or no construction geometry and other intermediate steps, little or no switching between tools, and the user receiving immediate feedback to prevent errors. The logic is also optimized to result in the most likely user desired outcome. Snapping to perpendiculars, snapping near congruent edges and snapping vertices together are some examples how the embodiments of vertex manipulation will save the user time.

Embodiments of interactive simulation and solver system may be used for various types of systems. For example, mechanical systems, fluid transfer systems, or electro-mechanical systems may be implemented using the embodiments of the interactive simulation and solver system. In an example embodiment, all systems of cars, airplanes or computers may be simulated by the embodiments of the interactive simulation and solver system.

BRIEF DESCRIPTION

FIGS. 2a-2c are a sequence of displays that illustrate an edge being collapsed by moving a vertex as displayed by the system in FIG. 1.

FIGS. 7a-7c are a sequence of displays that illustrate at least a portion of a gap between two surfaces being filled by moving a vertex as displayed by the system in FIG. 1.

FIGS. 9a-9c are a sequence of displays that illustrate the system in FIG. 1 generating lines that aid a user to create perpendicular edges on a surface.

FIGS. 10a-10c are a sequence of displays that illustrate a curved edge of a surface being expanded by moving a vertex that is connected to the curved edge.

DETAILED DESCRIPTION

Using the embodiments of the present invention a user may repair Computer-aided design (CAD) geometry for use in Computer-aided engineering (CAE) modeling operations. The modeling operations include, but are not limited to meshing, load definition, boundary condition definition and design variable definition. A user may modify the objects of the geometric model using a mouse, other pointing device or physical gestures.

For example, a user may repair the objects that form a model by moving a vertex of an object from its initial location to a new location using an input device, such as a pointing device. As the user moves a vertex of an object from its initial location to its final location, the system aids the desirable set of possible intermediate or final locations. The system provides visual feedback to the user indicating the suggested locations and resulting shape. Once the user stops moving the vertex and releases the vertex, the system updates all geometry connected with the vertex to ensure topological congruence and slope continuity for all adjoining edges.

Geometry repair refers to the modification of CAD geometry in such a way that all vertices and edges of a sheet body, curve body or solid body that are internal to the curve bodies, sheet bodies, or face bodies are shared by one or more curves, edges or faces unless they represent an external boundary of the geometry. The system is configured to receive user input provided by a mouse or other pointing devices to modify the geometric and topological entities that collectively make up the two or three-dimensional geometric model. The system is configured to generate a graphical display of the geometric model, visual feedback and manipulation handles. Examples of the graphical display, visual feedback and manipulation handles are described in greater detail below with reference to FIGS. 2a-14c.

Figure 1:
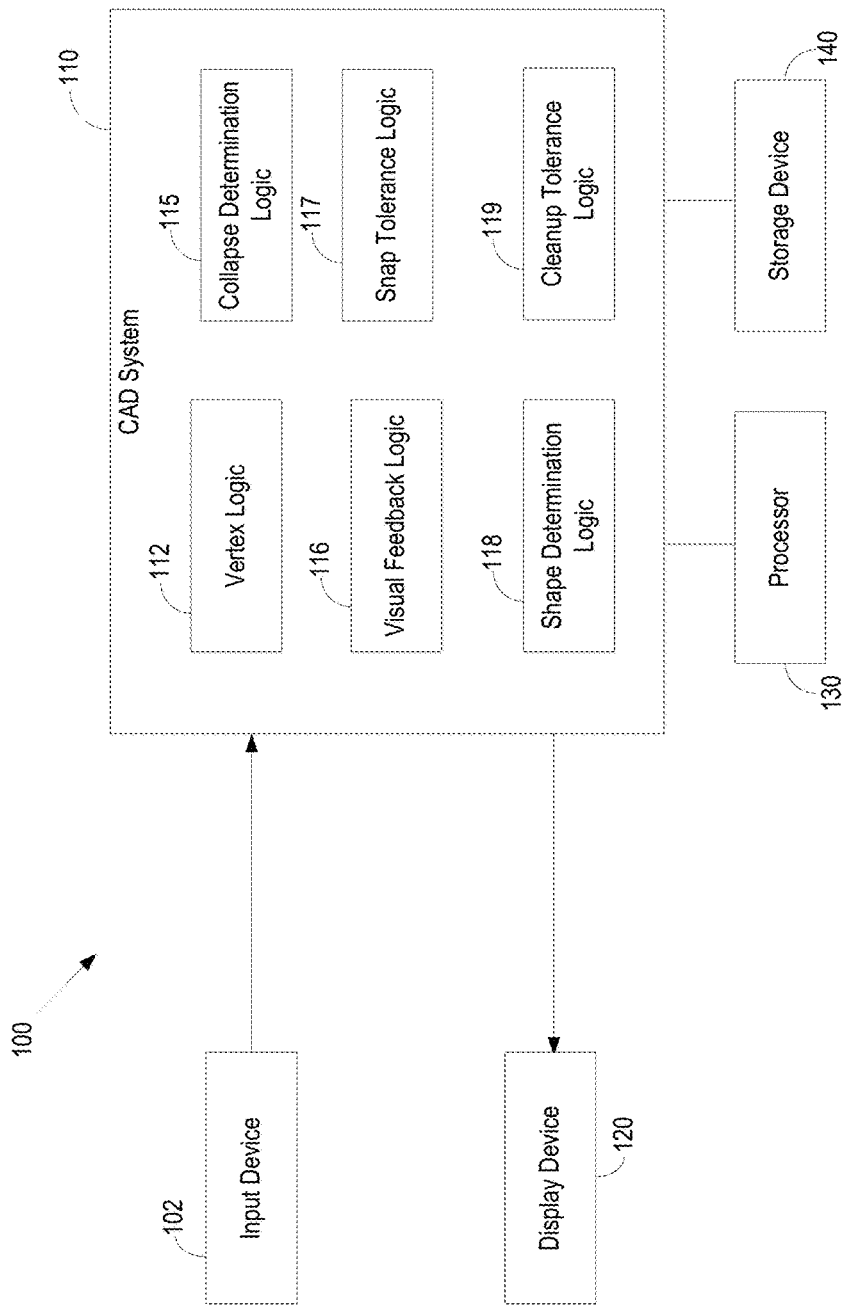
FIG. 1 is a schematic diagram of a data processing system according to an embodiment of the present invention.

Referring to FIG. 1, FIG. 1 is a schematic diagram of a data processing system 100 according to an embodiment of the present invention. System 100 includes a user input device 102, CAD system 110, display device 120, processor 130 and storage device 140. The system 100 may include other devices such as network logic, wireless communication, printer and other known devices.

The input device 102 as described herein may include a computer with a monitor, keyboard, keypad, mouse, joystick or other input devices performing a similar function. The input device 102 may include a keyboard including alphanumeric and other keys, and may be coupled to the bus for communicating information and command selections to the processor 130. In one embodiment, the input device 102 has a touch screen interface or movement sensing interface that may be combined with, or separated from, display device 120. The input device 102 can include a cursor control device, such as a mouse, trackball, touch screen, motion sensor or cursor direction keys, for communicating direction information and command selections to the processor 130 and for controlling cursor movement on the display device 120. The examples illustrated in FIGS. 2a-14c describe the functions of a mouse having a left mouse button, center scroll mouse button and right mouse button. Other types of input devices may achieve functionality similar to the mouse or a combination of different input devices described herein.

The CAD system 110 may be a computer system that is in communication with the input device 102, display device 120, processor 130 and storage device 140. In one implementation, the CAD system 110 may be stored on a non-transitory storage medium that is at the same location as the user input device 102. In another implementation, the CAD system 110 may be located in a different location than the input device 101. For example, the CAD system 110 may communicate with the input device 102 through a network or wirelessly. Accordingly, the CAD system 110 may be a cloud-based system that provides software as a service. In another embodiment, the CAD system 110 may include the processor 130 and the storage device 140.

The processor 130 may be configured to receive instructions from the input device 102 and CAD system 110. For example, the instructions may request the processor 130 to calculate the distance between two vertices, the area of a resulting shape, snap tolerances and constraints for the vertices, edges and surfaces. The processor 130 is configured to receive data from and calculate results for each of the logics within the CAD system 110. The processor 130 may be, but is not limited to being, an Intel® designed processor, AMD® designed processor, Apple® designed processor, QUALCOMM® designed processor, or ARM® designed process.

The storage device 140 may include a memory such as a random access memory (RAM) or other dynamic storage devices. In another implementation, the storage device 140 may also include non-transitory storage media that is configured to store information regarding the geometric model that is being currently modified or was created in the past. The storage device 140 may send or receive data to or from the processor 130 and each of the other systems in the system 100. For example, the storage device 140 may be configured to communicate with the input device 102, CAD system 110 and display device 120. In one embodiment, the storage device 140 may be a remote storage device that stores the CAD system 110 data in a different location than the input device 102 or the CAD system 110. In another embodiment, the storage device 140 may be located on the same computer system as the input device 102 and/or the CAD system 110.

The CAD system 110 is configured to provide a user with the functionality described below with respect to FIGS. 2-14c. The CAD system 110 includes a vertex logic 112, collapse determination logic 115, visual feedback logic 116, snap tolerance logic 117 and shape determination logic 118. The CAD system 110 may receive the geometric model information either from the user or from the storage device 140. In some implementations, a third party may provide the model information. Upon receiving the model information, the CAD system 110 may display the geometric model on the display device 120. A user may choose to edit the objects within a geometric model. The objects may have vertices and edges that connect the vertices.

The vertex logic 112 is configured to receive user input requesting that a selected vertex or vertices be moved from a starting location to another location. The vertex logic 112 is configured to communicate the movement information for the vertices to each of the other circuits or modules of the CAD system 110. In particular, the vertex logic 112 communicates the new vertices locations to the visual feedback logic 116 as the user moves vertices. This information allows the visual feedback logic 116 to generate a new edge or surface representing the resulting shape, if the user were to deselect the vertices that are being moved. The vertex determination logic 116 may perform various steps to determine the resulting shape and/or evaluate the movement of a vertex to determine if the move is valid. If the vertex movement is not valid, then the vertex determination logic 116 aborts the vertex movement and the vertex determination logic 116 may provide a clear error message. If the vertex is moved to an edge then the edge may be split at the moved vertex unless the vertex was dragged onto another vertex. The vertex determination logic 116 may evaluate all neighboring edges to determine if congruency is achieved. The shape determination logic 118 may update the effected surfaces and graphics to reflect the modifications.

The collapse determination logic 115 may receive input from the vertex logic 112 and determine whether the resulting surface or vertex should collapse because a vertex was moved on top of another vertex or an edge was moved on top of another edge.

After receiving data from vertex logic 112, the visual feedback logic 116 generates dashed lines showing possible locations that a vertex or edge may be placed. The visual feedback logic 116 may also generate an outline of the resulting shape of the objects after the user has moved a vertex or edge to a particular location. Moreover, the visual feedback logic 116 continues to determine the new shape each time a user moves a vertex or edge and displays the dashed lines providing guidance to the user regarding the resulting shape on the display device. While the vertex is being dragged, a thin, dotted or semi-transparent line will trace the approximate new edge shapes if the vertex was released. The new shape is visible, but not so bold that it obscures the rest of the geometry. When the vertex is released, the final geometry is calculated and projected onto the proper surface curvature. The original geometry will be unmodified until the vertex is released. If the edges are curved or the "preserve tangents" mode is active, then the graphical feedback should reflect that by showing curved edges bending along with the vertex drag.

The snap tolerance logic 117 may establish the range of the snap tolerances for each vertex, edge, object or groups of objects in the model. The snap tolerance for any object may be a region of drawing space that surrounds each object. For example, the snap tolerance region of a vertex may be a square region surrounding and encompassing the vertex. The snap tolerance region for an edge may be a rectangle surrounding and encompassing the edge. The snap tolerance region for a surface may be a region surrounding the surface and shaped similar to the surface. In one implementation, the snap tolerance region is a predefined distance away from the shape of the object. In one implementation, the snap tolerance logic 117 may detect that the user is moving a vertex, edge or object in the snap tolerance region of another vertex, edge or object. Upon detecting that a vertex, edge or object is within the snap tolerance of another vertex, edge or object, the snap tolerance logic 117 may generate a constraint such that the object within the snap tolerance is automatically moved, without any further input from the user, to the other vertex, edge or object. For example, if a first vertex enters the snap tolerance region of a second vertex, then the snap tolerance logic 117 moves the first vertex to be on top of the same location as the second vertex. In this example, the user may not want to snap the first vertex on top of the second vertex and the user may move the first vertex away from the second vertex to unsnap the two vertices.

In one implementation, the system 100 may require that the user move the first vertex out of the snap tolerance region of the second vertex for the display device to show that the first vertex is moving away from the second vertex. In another embodiment, the user may enable or disable the snap tolerance logic 117 for any one of vertices, edges or objects that may be moved. In another embodiment the user may use a keyboard key to temporarily activate or deactivate the snap tolerance properties of the vertex, edge or object that is being moved. In one embodiment, the snap tolerance region for any object in a model may not be visible, however a user can change the settings to display the snap tolerance region for one or more objects. In other embodiments, the user may choose to have the snap tolerance region of an object displayed as the user moves an object into the snap tolerance region of another object. The snap tolerance logic 117 may be configured to detect the distance between objects. The snap tolerance logic 117 may determine which portion of the objects will be snapped together based on the distance between the closest parts of the objects.

With respect to vertices movement and snapping, the vertices may be moved along edges or to specific key points. It is common for users to try to maintain or create perpendicular and parallel edges. Accordingly, the snap tolerance logic 117 is configured to favor perpendicular and parallel movements. These snap points and snap features will be guides to the user to aid in the cleanup of the geometric model.

The snap tolerance logic 117 may implement various vertex and edge behaviors discussed herein. For example, when dragging a vertex, if the input device gets within snap tolerance region to any edge, then the edge may be highlighted and the vertex will snap onto that edge. As long as the input device remains within the snap tolerance region of an edge, the vertex will stay along the curve of the edge while following movement of the input device. If the input device is moved away from the snap tolerance region of the edge, then the dragged vertex snaps back to the input device position. Once a vertex is snapped to an edge, if it is dragged near another edge, but is still within snap tolerance region of the current edge, the vertex will stay snapped to the currently snapped edge.

The shape determination logic 118 may receive data from the vertex logic 112, collapse determination logic 115 and snap tolerance logic 117 to determine the resulting shape of the object that was modified while the user is continuing to move an element (vertex or edge) of the object. The shape determination logic 118 may send data to the visual feedback logic 118 to provide the user with visual feedback regarding the resulting shape in comparison to the original shape. For example, the resulting shape of the object may be shown using dashed lines overlaid on the original shape allowing the user to view the resulting shape. Moreover, the shape determination logic 118 may adjust the curvatures of various objects to create a resulting shape that is in congruence with the moved object.

The cleanup tolerance logic 119 is configured to remove small cracks, gaps, small overlaps, small edges and duplicate vertices. For example, when a user moves a vertex to be on top of another vertex as shown in FIGS. 2a-2c, one of the vertices is removed from the surface. In another embodiment, if an edge is moved from one edge to another edge and the surface is not removed, the edge that was moved to be on top of the other edge may be removed. Accordingly, the cleanup tolerance logic 119 and the snap tolerance logic 117 may detect small edges or small areas that are part of the surface. The snap tolerance logic 117 and cleanup tolerance logic 119 may remove the small edge or small area from the surface geometry. The edge attached to an edited surface may be replaced when the adjacent edge is moved on top of the edge. The cleanup tolerance value may be less than or equal to the snap tolerance value. A user may choose the cleanup tolerance value using a menu option. In one embodiment, the cleanup tolerance can be $\frac{1}{2000}^{th}$ the size of the largest model that may be created based on the geometric model. In another embodiment, the cleanup tolerance may be selected by the user to 1, $\frac{1}{100}^{th}$, $\frac{1}{1000}^{th}$, $\frac{1}{1500}^{th}$ the size of the largest model. The cleanup tolerance logic 119 may search the surfaces in a geometric model for edges or vertices that are smaller than the cleanup tolerance and remove them. In one embodiment, the cleanup tolerance logic 119 may performed the cleanup tolerance check after every change in the surface geometry.

For example, after each vertex drag operation is completed, all edges previously associated to this vertex and any new edges now associated to it are evaluated to determine if the size of any edges are less than the cleanup tolerance. If they are, then the edge is collapsed down to either an existing vertex and all associated edges are adjusted. When there are edges that overlap each other or edited such that they fall within cleanup tolerance of another edge on the same surface, at least one edge is deleted by the cleanup tolerance logic 119.

The system 100 may receive user input to interact with the model by dragging a vertex and snapping the dragged vertex with objects connected to the vertex. Dragging a vertex may be initiated by a user choosing to select and hold a vertex with a user input device (i.e. holding the mouse button down). The user may provide input to the input device to move the vertex. In response to the user input, the system may move the vertex and provide visual feedback to the user via a display device. The visual feedback may include, for example, one or more dashed lines showing the shape of the resulting object. In another embodiment, if multiple vertices are selected at once, then selecting any one of the vertices and continuing to hold the left mouse button down will move all of the selected vertices. The mouse graphic may be changed to inform the user that the user can perform a drag. The mouse graphic may change when the user input device hovers over a vertex while the system is in a surface (or face and curve) editing mode. In another embodiment, when the left mouse button is released, the selected vertex is released at the location at which the left mouse button is released so long as the location is valid. If the vertex released location is not considered valid, then the vertex is not moved, and an appropriate error message is displayed on the display device.

Snapping the dragged vertex with objects connected to the vertex may be performed after the dragging operation has been completed. The system evaluates the newly formed shape to determine vertex and edge congruency, edge or surface collapse and surface split or partial collapse. To evaluate the congruency of two or more edges, the shape determination logic may perform a two-step process. First, the two vertices of each edge are determined to be either shared or within the current cleanup tolerance. The distance between the edges should not exceed the current cleanup tolerance at any place along their length. The procedure to evaluate distance between two edges can include evaluating the coordinate location at N number of parametric locations (depending on length and amount of curvature) along edge A, and then calculating the distance between these locations for edge B. If the distance between the two edges is within a cleanup tolerance defined by the user then the edges may be combined.

Referring to FIGS. 2a-2c, FIGS. 2a-2c show an example of an edge collapse procedure that may be implemented by the system in FIG. 1. In particular, FIG. 2a depicts a surface 201 and surface 202 placed adjacent to each other at an angle. Surfaces 201 and 202 each have multiple vertices and each surface represents a physical object that may be manufactured. Surface 201 has an edge that is adjacent to an edge of surface 202. The system 100 highlights the two adjacent edges by either using a different color for the shared edge or by darkening the edges that are in contact with each other. In the example shown in FIG. 2a, edge 203 is shown as being darker than the other edges, like edge 215a. Surface 201 shows vertex 207 which is selectable by a user. Surfaces 201 and 202 share a vertex 209. Vertices 207 and 209 are connected by edge 215a.

FIG. 2b illustrates a user moving the vertex 207 toward the direction 211. In order for a user to select and drag the vertex 207, the input device 102 may receive input from the user and the input device may generate electrical signals that are transmitted to the CAD system 110. In particular, the vertex logic 112 may receive data indicating that the user has selected vertex 207 and initiated moving the vertex in a different direction. Once the user initiates the movement, the vertex logic 112 communicates the fact that a vertex is being moved to the visual feedback logic 116. In response, the visual feedback logic 116 generates a new edge 212 that may be shown in a different color than edge 215b. The new edge 215b may be shown as a dashed line until the user releases or unselects the vertex 207. Also shown in FIG. 2b, the snap tolerance logic 117 may be configured to show a snap tolerance region 213 for vertex 209 as vertex 207 is moved into the snap tolerance region 213 of vertex 209.

Accordingly, as vertex 207 enters the snap tolerance region 213, the snap tolerance logic 117 may move the vertex 207 to be directly on top of the vertex 209. The visual feedback logic 116 may generate an edge 212 that connects vertex 205 to vertex 209. Essentially, when two vertices that are connected by an edge are combined, the collapse determination logic 115 may determine that the connecting edge 215a may be collapsed. Accordingly, a new model with a collapsed edge 215a is formed in FIG. 2c. The edge 215b is expanded to connect vertex 205 and vertex 209 such that the edge 215a is removed from the surface 201. Also shown in FIG. 2c are example snap zones 220 around each edge. In one embodiment, the snap zones 220 are not shown to the user. In other embodiments, the user can choose to have the snap zones 220 be visible.

Figures 3A, 3B, 3C:
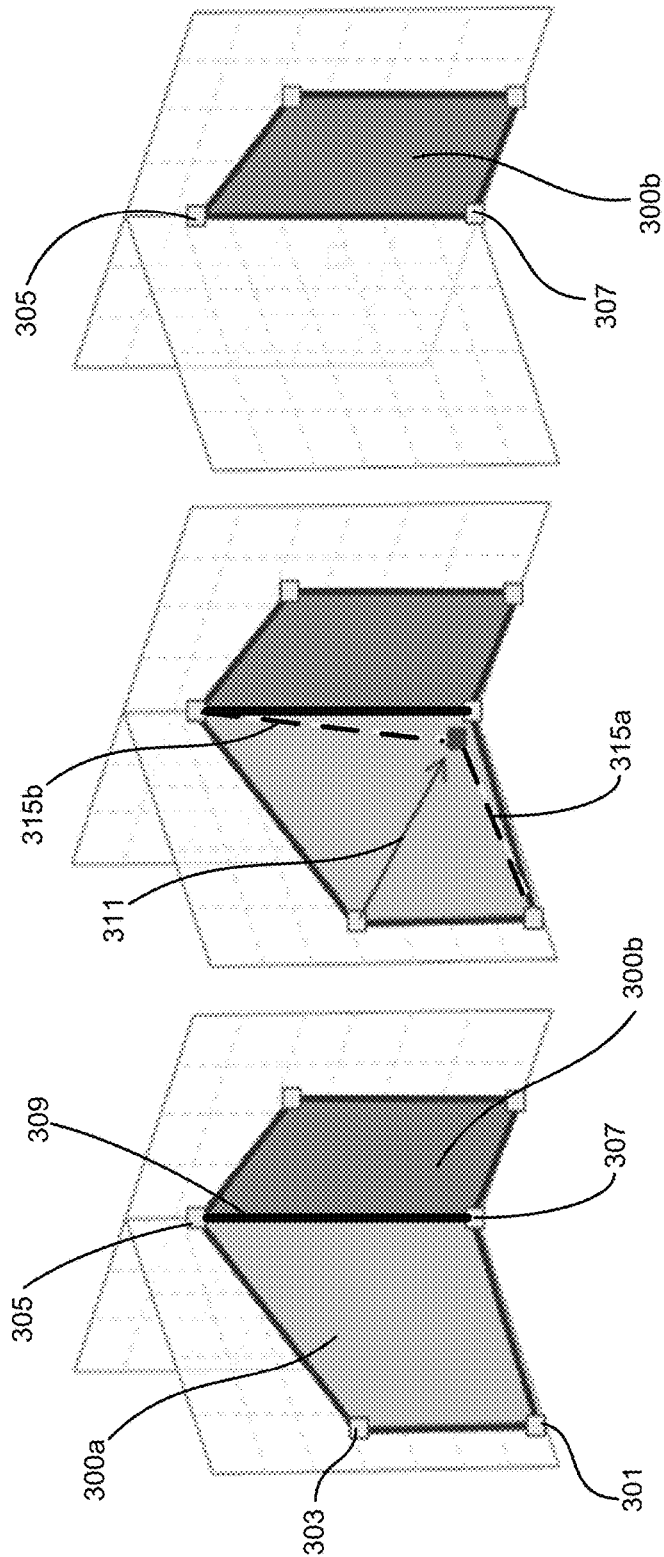
FIGS. 3a-3c are a sequence of displays that illustrate a surface being collapsed by moving a vertex as displayed by the system in FIG. 1.

FIG. 3a shows a surface 300a and a surface 300b connected at an angle, with the two surfaces sharing an edge 309, vertices 305 and 307. In this example embodiment, a surface may be collapsed or removed by combining two vertices, when the resulting area of the surface approaches zero within a tolerance or when the edges are all determined to collapse on each other. As shown in FIG. 3b, vertex 303 may be moved toward an opposing vertex 307 in a direction 311. Also shown in FIG. 3b, the visual feedback logic 116 may generate guidance lines 315a and 315b. The guidance lines 315a and 315b show the user the resulting surface vertex 311 being moved from the starting location towards its final location. Once vertex 303 reaches the snap tolerance region of vertex 307, vertex 303 is automatically moved to be on top of vertex 307 by the snap tolerance logic 117. If the user releases or unselects vertex 303 to be on top of vertex 307, then the collapse determination logic 115 may determine that the surface area of surface 300a is approaching zero within some tolerance or the edges are determined to be collapsed, then surface 300a is collapsed or removed from the drawing surface. FIG. 3c shows the resulting shape having only surface 300b. In another embodiment, a user may choose to retain the vertices or the collapsed edges. For instance, vertices 301, 305, 307 may be shown having a dashed line connecting each of them after surface 300a is collapsed.

Figure 4C:
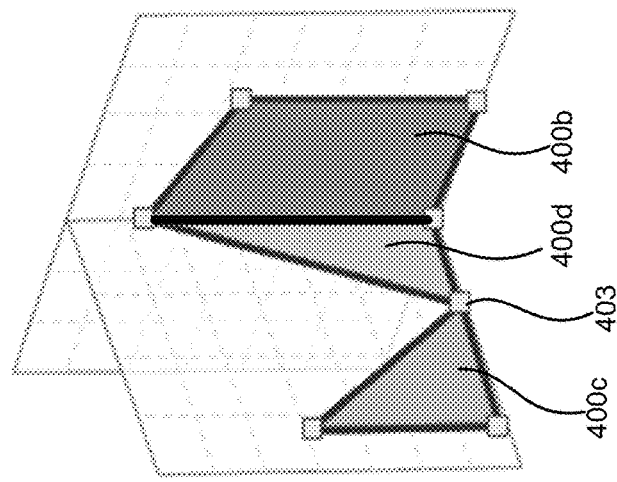
FIGS. 4a-4c are a sequence of displays that illustrate a surface being split in two surfaces by moving a vertex as displayed by the system in FIG. 1.
Figure 4B:
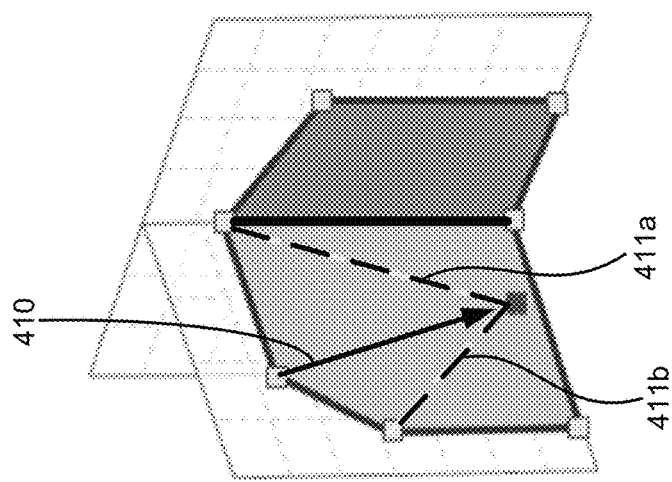
Figure 4A:
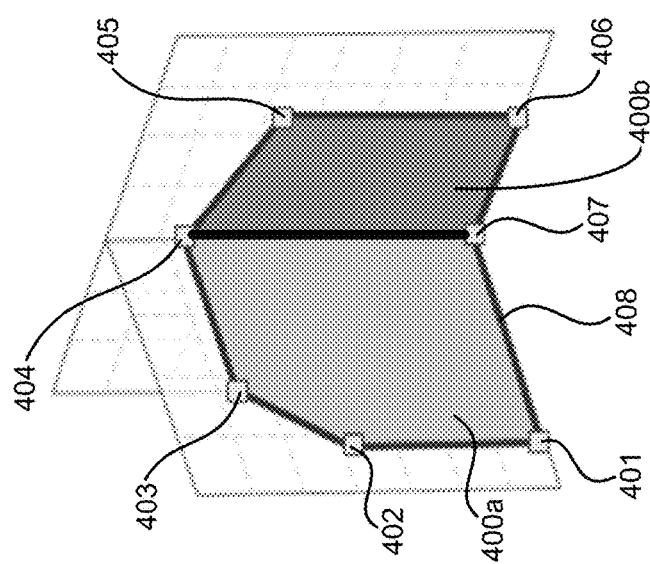

FIGS. 4a-4c show one example of how a user may choose to divide a surface by moving a vertex. For example, if a vertex is dragged across the surface onto another edge and it forms two separate areas, then the surface is divided into two separate surfaces. The snap tolerance of the edge may aid a user in moving a vertex onto an edge. For example, as soon as the user moves the vertex within the snap tolerance region of the edge the vertex will snap to the closest part of the edge.

FIG. 4a shows a surface 400a and 400b at an angle to each other having the edge connecting vertices 404 and 407 being in common with both surfaces. The common edge is highlighted by the visual feedback logic 116 to show the user that the edges are in contact with each other and there are no holes between the two surfaces. FIG. 4b shows the vertex 403 being dragged across to an opposing edge 408. FIG. 4b shows the guidance lines 411a and 411b showing the resulting shape as the vertex 403 is moved across the surface 400a. The guidance lines 411a and 411b may be shown as dashed lines or in a different color. Also shown to the user is the direction 410 in which the user is moving the vertex 403. The size of the direction 410 arrow is calculated based on determining the distance between the staring position and the current position of the vertex 403. Upon reaching the snap tolerance region of edge 408 which connects vertices 401 and 407, the snap tolerance logic 117 moves the vertex 403 to be on top of a portion of edge 408. Once the vertex 403 is move to the edge 408 the user may move the vertex 403 along the edge 408 until the user unselects or drops the vertex 408. As discussed above, a user may choose to unsnap the vertex 403 from the edge 408 and the user may drop or unsnap the vertex 403 by moving the vertex 403 away from the snap tolerance region of edge 408.

FIG. 4c shows the resulting shape created by moving vertex 403 on top of edge 408. In particular, FIG. 4c shows that surface 400a has been divided into two different surfaces 400c and 400d. The two surfaces share the vertex 403 and the visual feedback logic 116 may change the color of the shared vertex 403 to reflect the shared vertex status of vertex 403. Also shown in FIG. 4c is surface 400b which now shares an edge with surface 400d. The shared edge may be highlighted or changed in color as well.

Figure 5C:
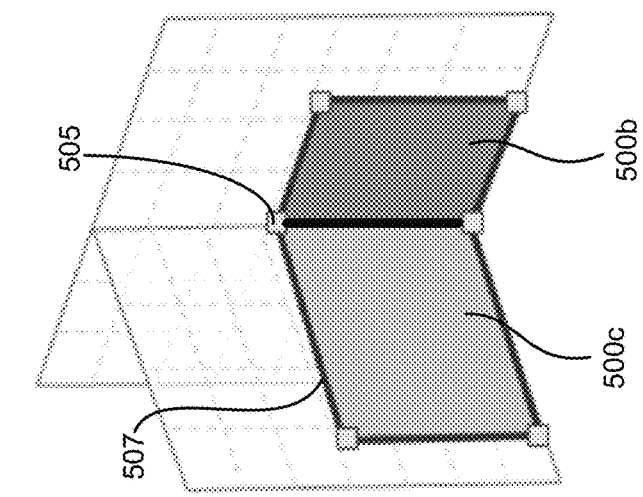
FIGS. 5a-5c are a sequence of displays that illustrate a portion of a surface being pinched off by moving a vertex as displayed by the system in FIG. 1.
Figure 5B:
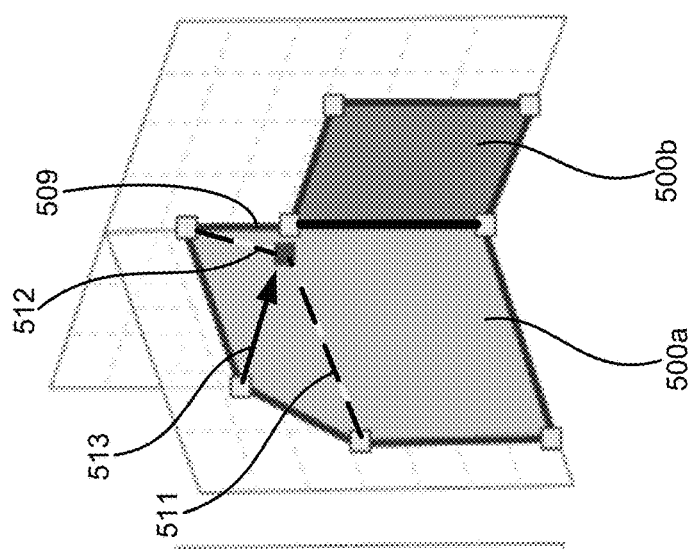
Figure 5A:
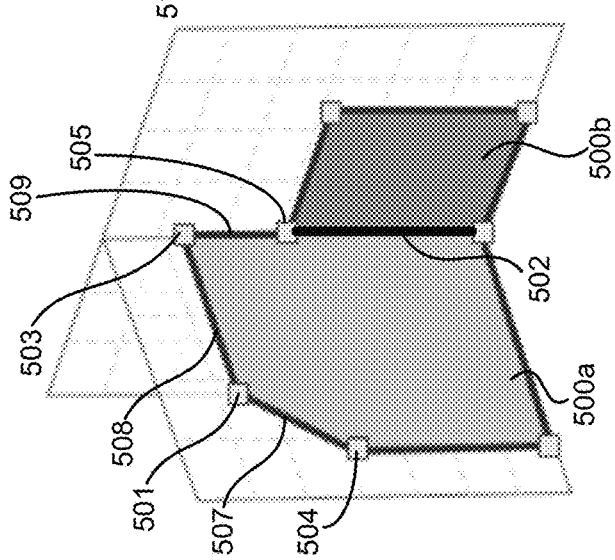

FIGS. 5a-5c show an example of a partial collapse of a surface where a vertex is moved to pinch off part of a surface by creating an edge that spans at least one dimension of the surface, and the pinched off area may be deleted. FIG. 5a shows surfaces 500a and 500b each having a shared edge 502. However, the edge 509 of surface 500a extends between vertices 503 and 505 and the edge 509 is not shared with surface 500b. FIG. 5b shows vertex 501 being moved towards vertex 509 in direction 513. FIG. 5b also shows the visual feedback lines 511 and 512 created by the visual feedback logic 116. In particular, the visual feedback line 511 is extended from vertex 504 to vertex 509 when vertex 501 approaches the snap tolerance region of vertex 505. When vertex 501 is released, the collapse determination logic 116 can determine that the resulting surface 500c is a pinched off version of surface 500a. In particular, the region of surface 500a that is above vertices 504 and 505 has been removed because it has zero area or almost zero area. FIG. 5c shows new rectangular surfaces 500c.

When a vertex is dragged onto another edge, either part of the same surface or a new surface, then the edges are evaluated to determine if any edges have become congruent and/or are overlapping. FIGS. 3c and 5c show cases where a vertex is dragged onto an edge or another vertex within the same surface creating potential overlapping edges. If the edges are determined to be within the snap tolerance, then they are considered congruent. Depending on the situation, the surface may be deleted (see FIG. 5c), or cause the whole surface to be deleted as shown in FIGS. 3a-3c.

Figure 6C:
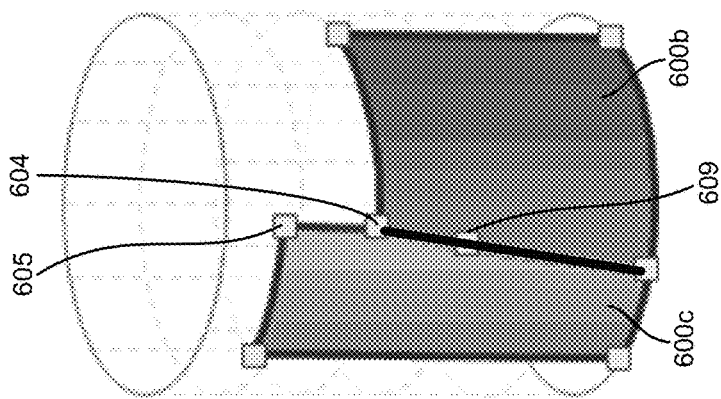
FIGS. 6a-6c are a sequence of displays that illustrate a gap between two surfaces being filled by moving a vertex as displayed by the system in FIG. 1.
Figure 6B:
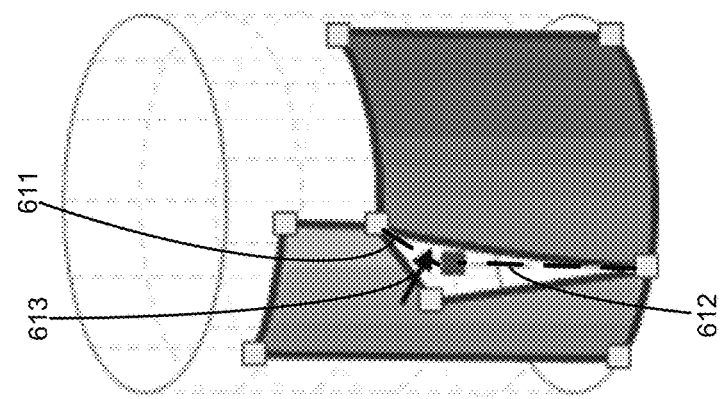
Figure 6A:
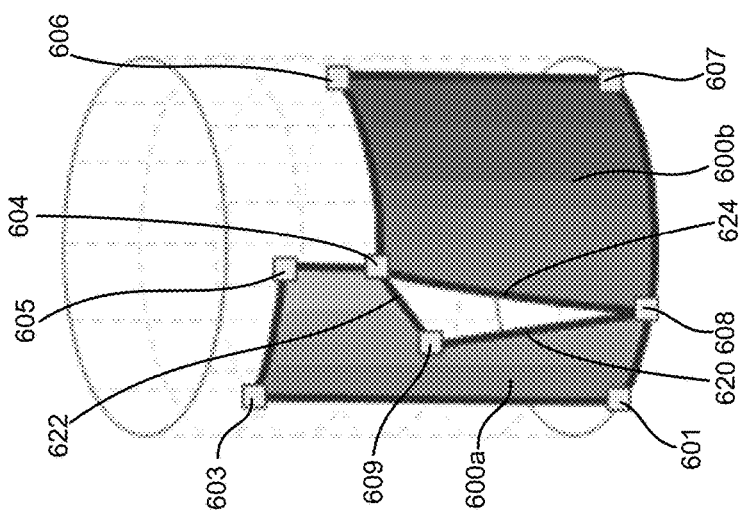

FIGS. 6a-6c show a vertex being dragged onto an edge of another surface. Since the overlapping edges have the same curvature within a tolerance level, the two edges are merged. The surfaces become congruent as shown by FIG. 6c. The shared edges may be shown by a different color than the unshared edges. FIG. 6a shows a surface 600a having multiple edges and vertices. Surface 600b is located adjacent to the surface 600a and the two surfaces share two vertices 604 and 608. Edges 620 and 622 of surface 600a in combination with edge 624 of surface 600b surround a space that may not be desirable to a user. An example method of closing the space may be performed by moving vertex 609 toward edge 624. FIG. 6b shows the image of a user moving vertex 609 towards edge 624. When the vertex 609 is within the snap tolerance region of edge 624, the vertex will snap to edge 624. The overlapping edges from surface 600a and surface 600b have a similar curvature and thus the shape determination logic 118 can form a new edge for surface 600a that is similar in curvature to edge 624 of surface 600b. FIG. 6c shows the resultant shape formed of surface 600c and surface 600b.

Referring to FIGS. 7a-7c, FIGS. 7a-7c show two surfaces where congruency of the edge was not achieved because it may not have been intended. FIGS. 7a-7c show that once the vertex 705 was moved, one adjacent edge 707 of the edited surface was found to be congruent, but the other edge 710 was not congruent to edge 709. This may have been desired by the user. In one embodiment, the user may use another tool to force the congruency since the curves are farther apart then the cleanup tolerance or the congruency range.

FIG. 7a shows surfaces 700a and 700b connected by two vertices 701 and 703. If a user chooses to move vertex 705 towards vertex 702 in direction 715, then the two surfaces 700a and 700b may share three vertices 701, 702 and 703. FIG. 7c shows the resulting shape. The resulting shape has a space between surface 700a and 700b. The reason a gap is left in the surface is because the curvature of edge 710 is not similar to the curvature of edge 707. In one embodiment, if the user wants to close the gap, the user may drag vertex 702 towards vertex 703 in a direction 719 along the edge 709. The shape of surface 700b may be expanded to fill in the gap between surface 700a and 700b. If the user wants to slide a vertex along the existing edge without changing the edge curvature, then the vertex may span to the existing edge 709 which stays or sticks to that edge as long as the input device is within the snap tolerance region of edge 709. The vertex 702 will continue to slide along the edge 709, following the input device as close as it can. Using the methods described above the user can easily position a vertex to control the surface 700b.

Figure 8:
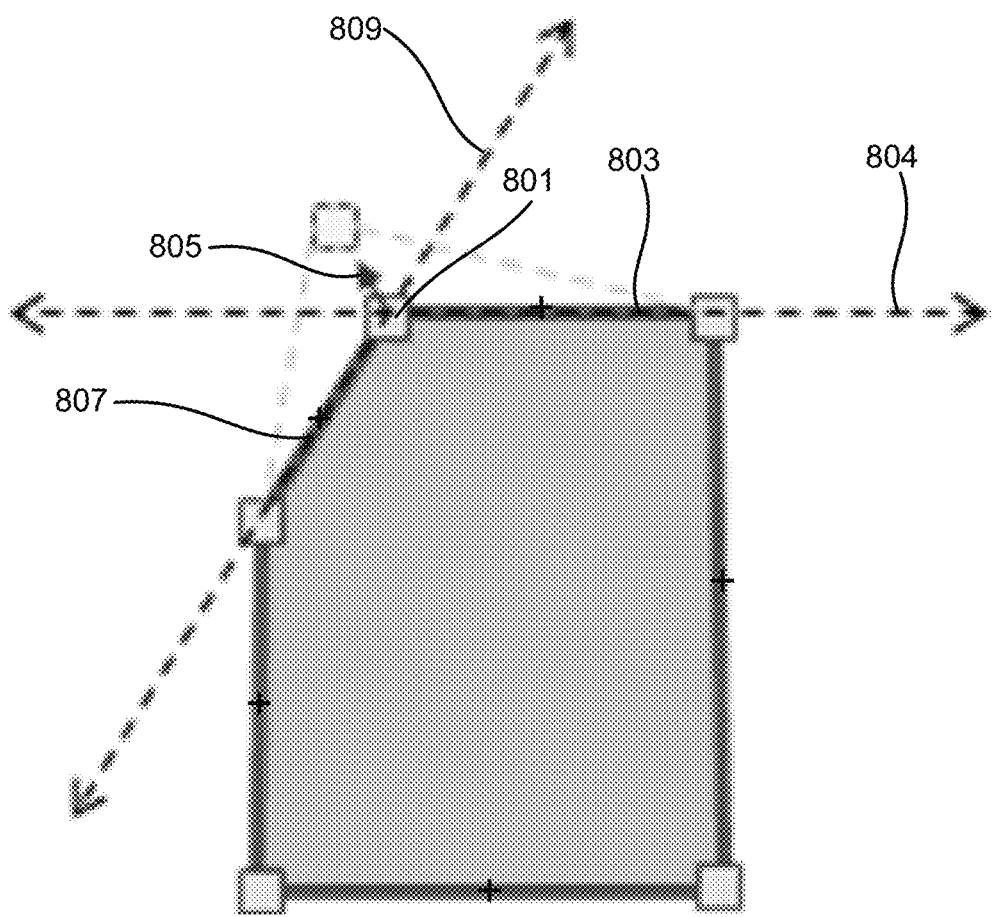
FIG. 8 is an illustration of extrapolated lines generated based on the edges of a surface when a vertex of the surface is moved.

FIG. 8 illustrates various behaviors of edges on either side of a vertex. Edges on either side of the vertex are special in that the vertex will snap to its extrapolated path as well as the actual physical edge. This may allow the user to increase the length of an edge or maintain angles as the surface size is increased. All other behaviors for these edges are the same as any other edge. The behavior of dragging a vertex along its extrapolated edge curvature is present for edges that touch the vertex being moved. If several surfaces or curves also connect to this vertex, this behavior will also apply to them.

FIG. 8 illustrates the potential extrapolated edges that a vertex 801 may snap to. The dotted lines represent where a vertex can snap to if it is moved within the snap tolerance region of the line. In one embodiment, the dotted lines may not be shown graphically; they are shown in FIG. 8 here for an explanation. In another embodiment, the dotted lines are shown when a user selects a vertex and begins to move the vertex. If the edges are curved, then it is extrapolated using constant end curvature. These extrapolations will also fall in the extrapolated surface curvature. If any vertex is in the snap tolerance while dragging a vertex, then the dragged vertex will snap to this vertex. If the input device moves the vertex away from the snapped location and the vertex is moved outside the snap tolerance region, then the dragged vertex snaps back to the mouse location. Similarly, when a vertex is dragged along a curve or edge, if it reaches the snap tolerance region of the midpoint, it snaps to the mid-point in a similar way it would snap to a vertex or edge.

FIG. 8 shows a vertex 801 being moved in a direction 805. In one embodiment, when a vertex 801 that is connected to the edges 803 and 807 is moved, extrapolated edges 804 and 809 may become visible. Extrapolated edge 804 is parallel to edge 803 and may or may not be visible to the user. Extrapolated edge 809 is parallel to edge 807 and may or may not be visible to the user. Each extrapolated edge has a snap tolerance region and when a vertex is in the snap tolerance region surrounding the extrapolated edges, the vertex snaps to and moves along the length dimension of the extrapolated edges. The extrapolated edges are not limited in length to the length or width of the surface 800 as shown in FIG. 8.

Also shown in FIG. 8 are black cross-hair markers at all edge midpoints on surface 800. These are all possible snap points, which if approached to within snap tolerance, would cause the vertex to snap to the midpoint location. The visual feedback logic 116 generates some type of marker that is unique to this situation when a snap occurs so the user knows why the snap took place. Similarly, for curved arches the centers of the arc length and the center of the circle will also be treated as snap points. This behavior is identical to edge or curve midpoint snapping, except that the snap points are at the center of a circle or arc center. In one embodiment, a marker does not become visible unless a snap has occurred. In other embodiments, the marker is visible at all times.

FIGS. 9a-9c illustrate the system 100 allowing a user to create surfaces with orthogonal angles by moving vertices with connected edges. When a vertex is being dragged and a perpendicular angle forms between the adjacent edge and an attached edge to the adjacent edge, a snapping effect occurs. This perpendicular line behaves similar to an existing edge in that it can be snapped to and dragged along. For example, FIG. 9a shows a surface 900a with a vertex 904 that is connected to edges 911 and 912. Edge 912 is connected to edge 913 at a non-perpendicular angle "a" and edge 911 is connected to edge 910 at a non-perpendicular angle "b".

FIG. 9b shows a user moving vertex 904 in a direction 915. When vertex 904 is moved towards line 920 which makes edge 911 perpendicular to edge 910, the vertex 904 can snap to line 920 while the vertex 904 is in the snap tolerance region of line 920. Moreover, if vertex 904 is moved towards line 930 which would make edge 912 perpendicular to edge 913, the vertex 904 would snap to line 930. FIG. 9c illustrates the shape that is generated if the user dropped the vertex 904 while it is in the snap tolerance of line 930. Angle "a" in FIG. 9c is a 90 degree angle. Edges 912 and 913 are now at a 90 degree angle. Similarly, a dragged vertex will snap to a line where the two adjacent edges become tangent.

FIGS. 10a-10c illustrate surface edges that are curved and the vertex behavior when a vertex attached to a curved edge is moved. When vertices are moved all straight edges remain straight and curved edges remain curved. There are times when a user wants to force a curved edge to be straight or a straight edge to be curved. The system 100 is configured to treat edited curves in two different ways while moving vertices. Either edges will remain forced straight or will have its end tangents preserved. The user can chose one method or the other for the attached curves or use an automatic scheme which will preserve tangents on curved edges and keep straight on straight edges. FIGS. 10a through 10c show a vertex being moved where one of the attached edges is curved and the other edge is straight. FIG. 10a shows surfaces 1000a and 1000b that are connected by a vertex 1020. A user may wish to close the gap between the two surfaces and the user may drag vertex 1012 toward vertex 1014. Vertex 1012 is joining edges 1031 and 1030. Edge 1031 is a curved edge and edge 1030 is a straight edge. Here the shape determination logic 118 may determine that edge 1031 is curved and edges 1028 and 1030 are straight. Accordingly, the system 100 may extend the curved edge out to allow vertex 1012 to reach vertex 1014. The angle of edge 1030 is changed to be congruent with edge 1028 as shown in FIG. 10c. The visual feedback logic 118 displays the resulting shape of surface 1000b.

When determining if a curve is straight or curved, the system takes into consideration the curvature of the surface. If the surfaces in FIG. 10a were mildly curved, then the system 100 should understand that the vertical edge is contextually "straight" when ignoring the surface curvature and the highly curved edge will always be curved whether on a planar surface or not. In one embodiment, a user may set a curvature determination parameter using a slide bar to adjust the sensitivity of how a curve gets categorized as straight or curved. For example, the user can set a parameter for each edge or surface.

Figures 11A, 11B, 11C:
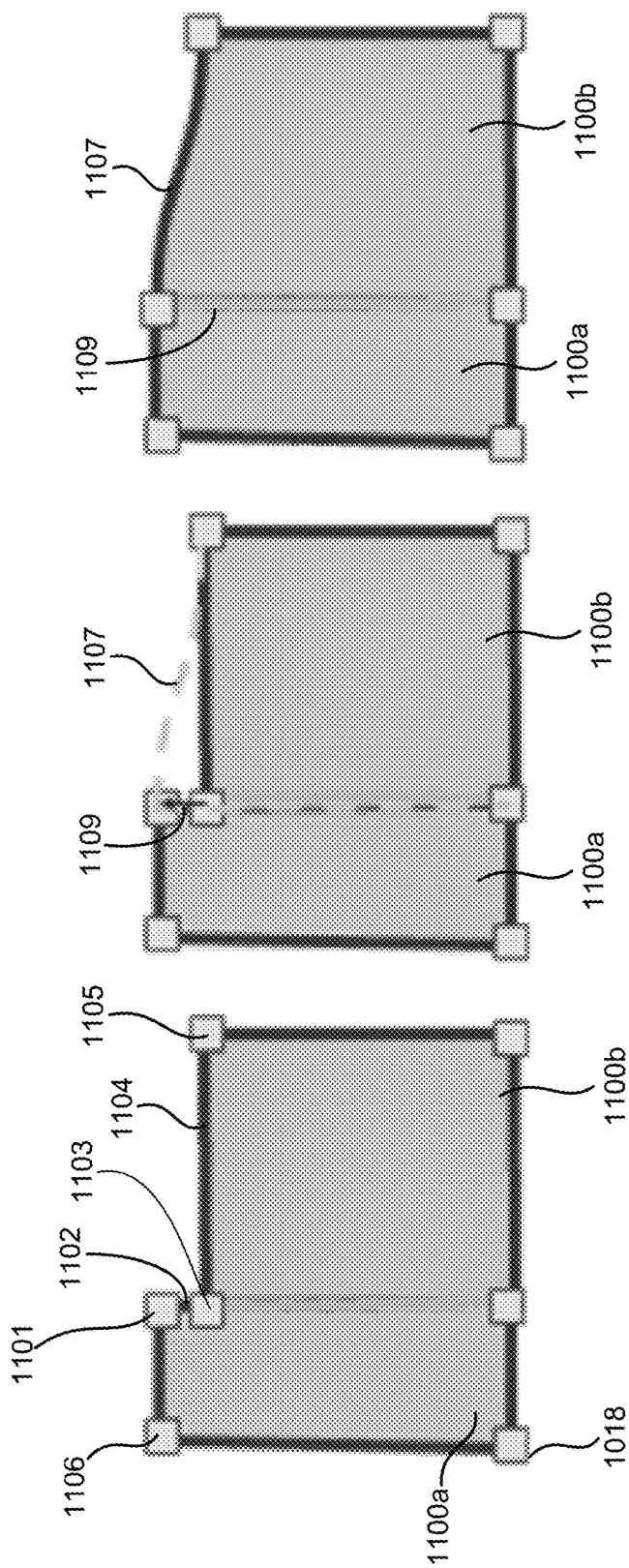
FIGS. 11a-11c are a sequence of displays that illustrate a straight line being converted to a curved line in a preserve tangents mode.

FIGS. 11a-11c show a vertex 1103 being moved while the system 100 is set to preserve tangents. There are cases where a user will want to preserve tangents on straight edges during an edit. When the preserve tangent mode is used, both edges connected to a vertex will preserve the other end of the edge. The examples shown in FIGS. 11a-11c show an edit where the vertex is dragged in the "preserve tangent" mode. Because of the preserve tangent mode, edge 1107 was straight, it produced a smooth curve preserving the tangents on either end of the curve. There are many cases where this is desirable for fine mesh models to avoid stress concentrations or poor quality mesh during the repair and idealization process of object modeling.

FIG. 11a shows surfaces 1100a and 1100b. Edge 1109 is shared between surfaces 1100a and 1100b. A user may choose to move vertex 1103 and connect it with vertex 1101. Edge 1104 is straight before the user moves the vertex connected to the edge. When vertex 1103 is moved, in this example, the preserve tangent mode may be activated. If the preserve tangent mode is activated, then the visual feedback logic 118 may generate an edge 1107 that is straight near its ends while the center of the edge 1107 is curved to connect the edge 1107 on each end. The curve generation in this example may be done using Bezier curve algorithms. FIG. 11b shows the visual feedback provided to the user when the user creates a new curved edge 1107. Based on the visual feedback the user may release the vertex 1103 and generate the surface 1100b as shown in FIG. 11c.

Figures 12A, 12B:
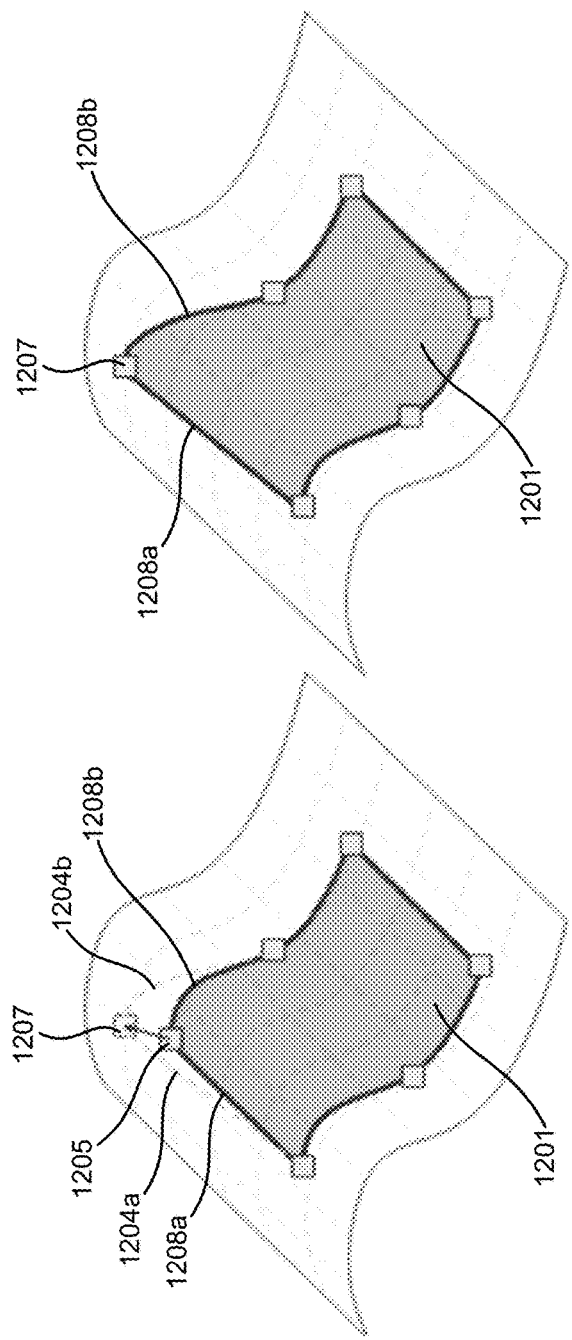
FIGS. 12a-12b are a sequence of displays that show moving the curvature of a surface based on a vertex on the surface being moved outside the surface.

FIGS. 12a-12c show the behavior of a surface when the curvature of the surface is following a curvature of an underlying curved grid and one of the vertices is moved outside the boundary of the surface. If a vertex is dragged outside the existing boundary of a surface and released, the behavior of the edit depends on where the vertex was released. If the vertex is released on a discrete location, like a vertex, edge location, hole center, curve center or other snap point, then the surface's curvature may bend or distort to that location if it is not on that surfaces extrapolated curvature. FIG. 12a shows a surface 1201 with its underlying parent surface 1203. The parent surface 1203 may or may not be visible to the user. When the user moves vertex 1205 in a direction that is away from the area occupied by the surface 1201, the visual feedback logic 116 generates dotted lines 1204a and 1204b to show the visual feedback of the edges 1208a and 1208b as they are being stretched with the vertex. The edges 1208a and 1208b are formed to conform to the parent surface 1203. As shown in FIG. 12b, the surface 1201 is formed with modified edges 1208a and 1208b.

Figure 13B:
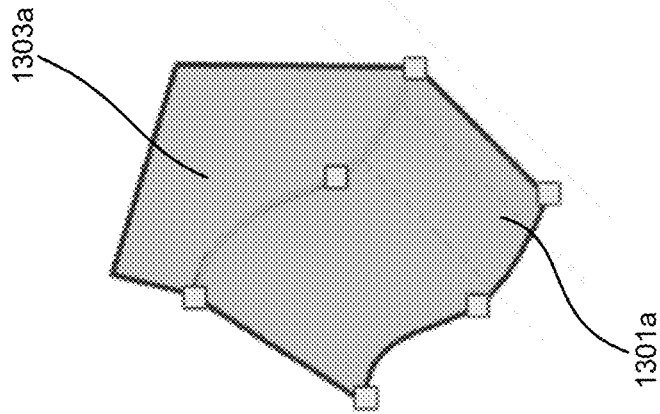
FIGS. 13a-13b are a sequence of displays that illustrate two surfaces being adjusted based on a vertex that is common to both surfaces being moved.
Figure 13A:
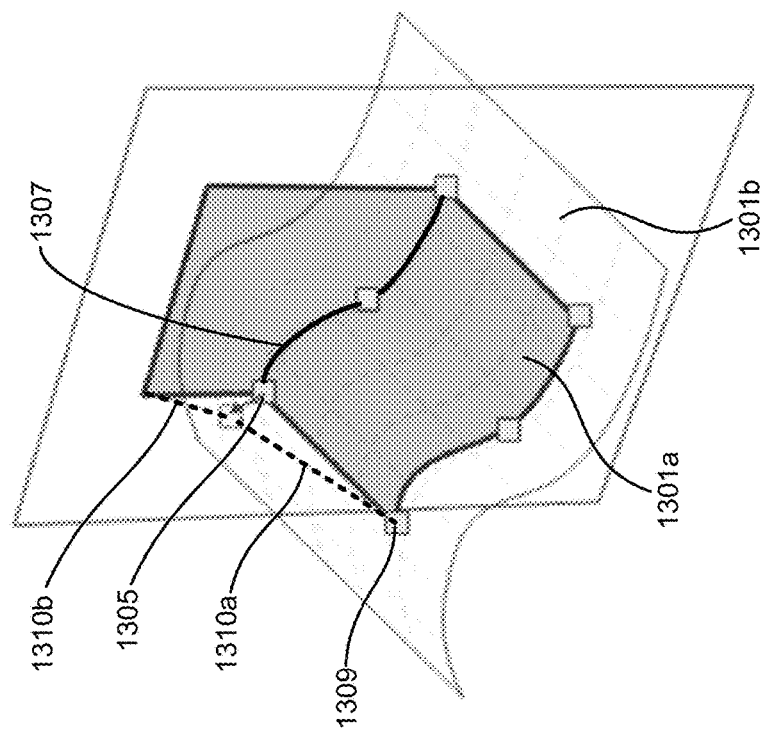

FIGS. 13a and 13b illustrate a surface 1301a that is connected to another surface 1303a. Surface 1301a lies on a parent surface 1301b that has a curvature as shown in FIG. 13a. Surface 1303a lies on a parent surface 1303b that is perpendicular to the parent surface 1301b. Vertex 1305 is shared by surface 1301a and surface 1301b. A user may choose to move vertex 1305, however, because vertex 1305 is connected to two different parent surfaces the user may choose which parent surface to move the vertex along. Accordingly, prior to moving the vertex 1305 the user may select a surface and then initiate moving the vertex 1305. In another embodiment, the user may move the vertex 1305 and the system may choose a parent surface to move the vertex along. In FIG. 13a vertex 1305 is moved away from both surfaces and released. The vertex 1305 could fall on the surface 1301 or surface 1305. Since the new location is not on an intersection between the two surfaces, one of the surfaces will be distorted out of its curvature. The user may choose a surface that is going to be distorted. In FIG. 13b, the user had chosen surface 1303a as the surface that will be distorted. Accordingly, the surface 1303a is moved and edge 1310a is moved to create a new shape as shown in FIG. 13b.

Figures 14A, 14B, 14C:
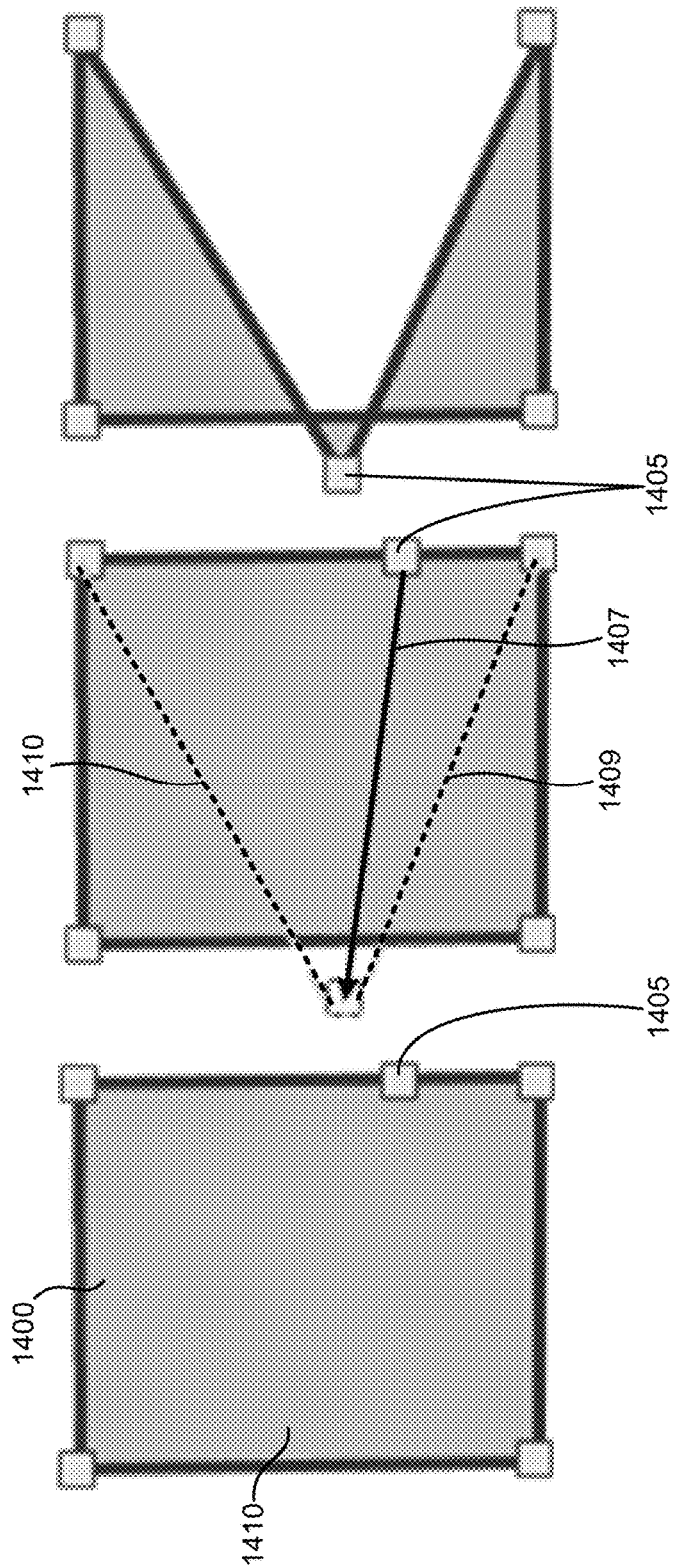
FIGS. 14a-14c illustrate vertex movement that leads to an invalid object topology.

FIGS. 14a-14c illustrate a surface 1400 with multiple vertices. A user may move vertex 1405 across an edge of the same surface in direction 1407. The guiding lines 1409 and 1410 are displayed for the user and the guiding lines may be shown in a different color to alert a user that the suggested vertex movement is not supported or leads to invalid topology. FIG. 14c shows the user having dropped vertex 1405 or past edge 1410. If a vertex is dragged in a way where there is no valid surface, then the vertex is not moved and an error message may be displayed to the user.

Figure 15B:
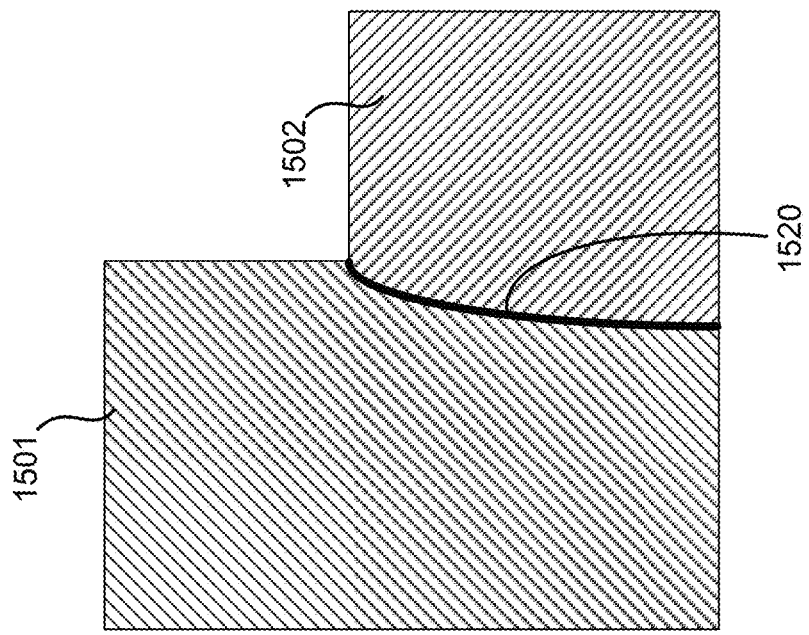
FIGS. 15a-15b illustrate an example display of cleanup tolerances.
Figure 15A:
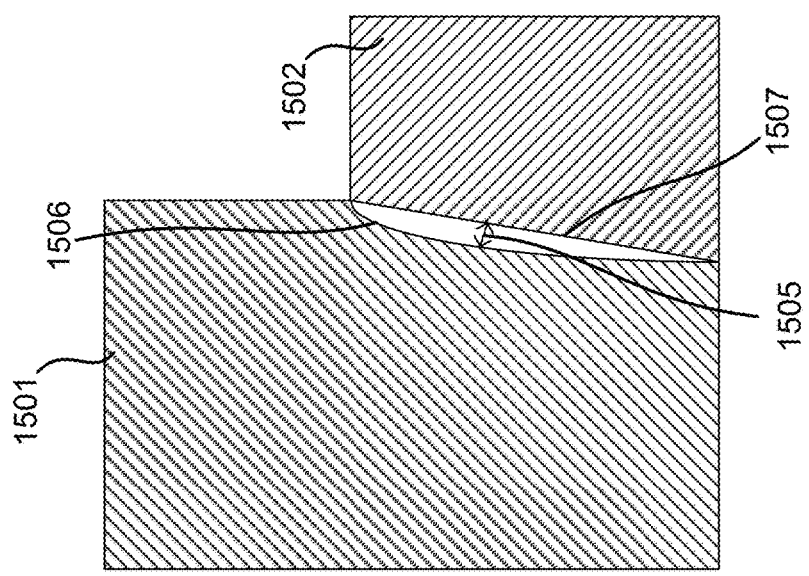

FIGS. 15a-15b illustrate surface 1501 and surface 1502 arranged to be adjacent to each other. FIG. 15a shows a gap 1505 between the edges 1506 and 1507. The cleanup tolerance logic 119 may detect the gap 1505 and generate a display for the user to choose an appropriate course of action to possibly remove the gap 1505. In one embodiment, the user may be provided with a display that allows the user to choose from among the following choices: expand surface 1501, expand surface 1502 or leave the gap 1505 as is. Expanding the surface to bridge the gap 1505 would mean that the edge of the surface that is expanded would conform to the edge of the nearby surface. For example, FIG. 15b shows a surface 1502 that was expanded to have a new edge 1520 that conforms to the shape of edge 1506. In one embodiment, the system will prompt the user when the gap 1505 is less than the cleanup tolerance. In an example embodiment, the cleanup tolerance may be $\frac{1}{2000}^{th}$ the size of the largest model. If the maximum width of the gap is less than the cleanup tolerance, then this will be closed and the edges will be said to be congruent. Accordingly, the cleanup in FIG. 15a was closed by expanding surface 1502 and creating a new edge 1520 that connects the two surfaces together. The system eliminates edges 1506 and 1507.

Figures 16A, 16B:
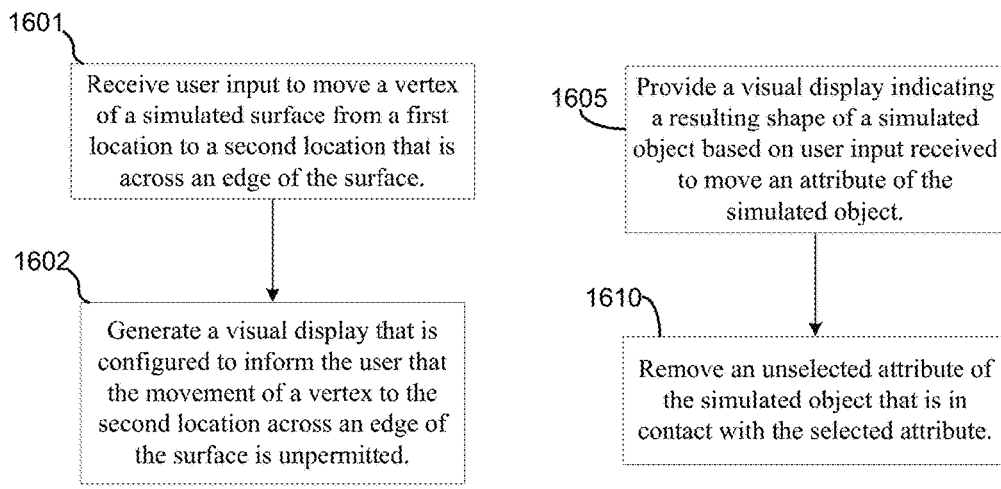
FIGS. 16a-16c illustrate various methods that may be implemented by the system in FIG. 1.

FIG. 16a is a method that may be implemented by the system shown in FIG. 1. FIG. 16a includes at least two processes. The process of FIG. 16a includes block 1601 and block 1602. In block 1601 the system 100 may receive user input to move a vertex of a simulated surface from a first location to a second location that is across an edge of the surface. The user may use an input device 102 to send electrical signals to the CAD system 110. In particular, the input device 102 may generate a signal to select a vertex and to drag the vertex towards another vertex or an edge. In one embodiment, when the user moves the vertex across an opposing edge of a surface, the system 100 may generate a visual display. For example, block 1602 provides an example of a process that may generate a visual display that is configured to inform the user that the movement of a vertex to the second location across an edge of the surface is unpermitted. In one embodiment, the system 100 may move the vertex back to the first location or to its original location when the user attempts to move the vertex to an unpermitted location.

FIG. 16b is a method that may be implemented by the system shown in FIG. 1. FIG. 16b includes two processes. At block 1605, the system 100 may provide a visual display indicating a resulting shape of a simulated object based on user input received to move an attribute of the simulated object. The attribute of the simulated object may be a vertex or an edge of a surface of the simulated object. In one embodiment, a user may move a first vertex to a second vertex, where the two vertices are connected to each other by an edge. The collapse determination logic 115 may remove the edge that was connected by the two vertices. At block 1610, the system may remove an unselected attribute of the simulated object that is in contact with the selected attribute.

Figure 16C:
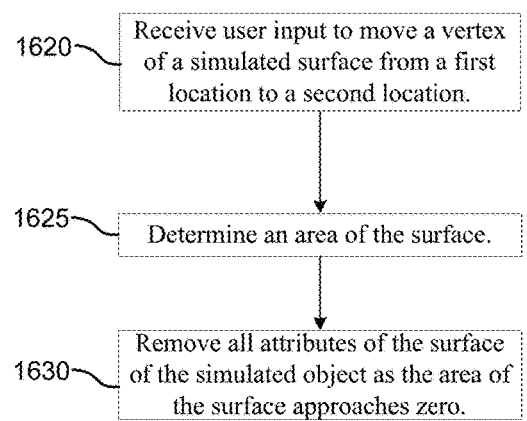

FIG. 16c is a method that may be implemented by the system shown in FIG. 1. FIG. 16c illustrates blocks 1620, 1625 and 1630. In block 1620, the system 100 may receive user input to move a vertex of a simulated surface from a first location to a second location that skips at least one or more edges of the surface. At block 1625, the collapse determination logic 115 may determine an area of the resulting surface. If the area of the resulting surface is less than the cleanup tolerance or approaches zero, then at block 1630, all attributes of the surface of the simulated object are removed. The cleanup tolerance may be determined based on the user parameters.

The proposed solution is better than past solutions due to the use of constraint management to guide users to more viable and meaningful solutions, the provision of visual feedback to ensure that users can see in advance the repair or improvement they are going to get. Hot point or snap point may be defined as a key location like a vertex, circle center or curve mid-point that a dragging vertex will snap to as long as it is within the snap tolerance. Snap tolerance may be the distance away from a hot point or snap feature that a dragging vertex will be snapped. Snap feature may be a surface edge or other features that a dragging vertex will slide along as long as the mouse is within snap tolerance. The tolerance used to decide if an edge, vertex or surface becomes congruent or collapsed. It is used to avoid gaps and tiny unmeshable features. A parent surface is an underlying extendable surface that represents the curvature of a surface.

The detailed description set forth above in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "logic", "data processing apparatus" or "computing device" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, while certain embodiments have been described with respect to searching of a single media type, i.e., image search or video search, one or more embodiments are also relevant to a generic search where the search results are blended with different media types. Thus, for example, a user can type in a keyword search phrase into an Internet search engine and obtains results that contain images, video and other media types blended with text results, and in which relevant matching advertisements are obtained (and provided to the user) that match one or more of these multi-media search results. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system, comprising:
 a vertex logic configured to receive user input to move, on a user interface, a selected attribute of a surface that is part of a simulated object;
 a collapse determination logic configured to:
  determine that an area of the surface approaches zero within a tolerance as a result of moving the selected attribute; and
  remove all attributes of the surface of the simulated object in response to determining that the area of the surface approaches zero within the tolerance.

2. The system of claim 1, wherein moving a selected attribute of the surface includes connecting one vertex with another vertex.

3. The system of claim 1, wherein removing all attributes includes removing each vertex and each edge of the surface.

4. The system of claim 1, wherein the selected attribute of the surface is a vertex or an edge.

5. The system of claim 4, wherein the area of the surface approaches zero by connecting the selected attribute with another attribute of the surface.

6. The system of claim 1, wherein the tolerance is one thousandths of a largest size of the simulated object.

7. The method of claim 1, further comprising determining whether the resulting shape meets the requirements for a shape that can be manufactured.

8. A device, comprising:
 means for receiving user input to move, on a user interface, a selected attribute of a surface that is part of a simulated object;

means for determine that an area of the surface approaches zero within a tolerance as a result of moving the selected attribute;

means for removing all attributes of the surface of the simulated object a in response to determining that s the area of the surface approaches zero within the tolerance.

9. A method for performing a simulation of a simulated object, comprising:
   receiving user input to move, on a user interface, a selected attribute of a surface that is part of the simulated object;
   determining that an area of the surface approaches zero within a tolerance as a result of moving the selected attribute; and
   removing all attributes of the surface of the simulated object in response to determining that the area of the surface approaches zero within the tolerance.

10. A non-transitory processor-readable medium comprising processor-readable instructions such that, when executed, configures a processor to:
   receiving user input to move, on a user interface, a selected attribute of a surface that is part of a simulated object;
   determining that an area of the surface approaches zero within a tolerance as a result of moving the selected attribute; and
   removing all attributes of the surface of the simulated object in response to determining that the area of the surface approaches zero within the tolerance.

11. The non-transitory processor-readable medium of claim 10, wherein removing all attributes includes removing each vertex and each edge of the surface.

12. The non-transitory processor-readable medium of claim 10, wherein the selected attribute of the surface is a vertex or an edge.

13. The non-transitory processor-readable medium of claim 10, wherein the tolerance is one thousandths of a largest size of the simulated object.

14. The non-transitory processor-readable medium of claim 10, wherein the processor is further configured to determine whether the resulting shape meets the requirements for a shape that can be manufactured.

15. A non-transitory processor-readable medium comprising processor-readable instructions such that, when executed, configures a processor to:
   receive user input to move, on a user interface, a selected attribute of a surface that is part of a simulated object;
   determine that an area of the surface approaches zero within a tolerance as a result of moving the selected attribute; and
   remove all attributes of the surface of the simulated object in response to determining that the area of the surface approaches zero within the tolerance.

* * * * *